(12) United States Patent
Loebach

(10) Patent No.: US 6,600,654 B2
(45) Date of Patent: Jul. 29, 2003

(54) SYSTEM FOR SECURING A PROCESSOR SOCKET

(75) Inventor: Beth Frayne Loebach, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 09/896,181

(22) Filed: Jun. 29, 2001

(65) Prior Publication Data

US 2003/0011994 A1 Jan. 16, 2003

(51) Int. Cl.[7] .................................................. H05K 7/20
(52) U.S. Cl. .......................... 361/719; 24/458; 257/727; 439/331
(58) Field of Search .......................... 439/73, 331, 342, 439/345, 485, 487; 257/718, 719, 726, 727; 248/316.7, 505, 510; 165/80.3, 185, 122, 126; 267/150, 160; 24/296, 453, 457, 458, 615; 361/687, 690, 695, 697, 703, 704, 712, 722, 717–719

(56) References Cited

U.S. PATENT DOCUMENTS

| 5,475,564 | A | | 12/1995 | Chiou .......................... 361/704 |
| 6,004,141 | A | | 12/1999 | Abe et al. ...................... 439/73 |
| 6,071,128 | A | * | 6/2000 | Brewington et al. ........... 439/73 |
| 6,188,577 | B1 | * | 2/2001 | Liu ............................... 361/704 |
| 6,343,013 | B1 | * | 1/2002 | Chen ............................ 361/695 |
| 6,452,800 | B2 | * | 9/2002 | Lee et al. ..................... 361/703 |

* cited by examiner

Primary Examiner—Gerald Tolin
(74) Attorney, Agent, or Firm—Sawyer Law Group

(57) ABSTRACT

A system for cooling a component in a computer system is disclosed. The system comprises a socket for receiving the component and for coupling the component to a planar. A heat dissipating element is coupled to the component and to the socket via a plurality of socket tabs coupled to the socket. At least two socket tabs include an embedded reinforcing strip which extends from the socket. A further aspect of the present invention provides securing the socket to the planar by extending the reinforcing strip from each of the at least two socket tabs through the socket and out of a bottom surface of the socket, and coupling the reinforcing strip from each of the at least two socket tabs to the planar.

22 Claims, 4 Drawing Sheets

SYSTEM FOR SECURING A PROCESSOR SOCKET

FIELD OF THE INVENTION

The present invention relates to cooling a processing unit in a computer system, and more particularly to securing a heat sink to the processing unit and securing the processing unit to a planar.

BACKGROUND OF THE INVENTION

As computer components evolve into more powerful devices, their power requirements consequently increase. With this increase in power consumption, a commensurate increase in power dissipation in the form of heat results. Microprocessors are a major source of heat in computer systems. One computer system might incorporate several microprocessors, thereby multiplying the amount of heat generated by the system. Moreover, the situation is compounded when several pieces of equipment are stored vertically in a rack, where each piece of equipment contains power consuming and heat generating components.

Heat dissipation is an important consideration in the design of modern-day computer systems. If heat is not adequately dissipated from the system, components may fail causing catastrophic damage to the system. Conventional cooling systems incorporate finned heat sinks and/or air movers in the form of fans, which are then coupled to the heat generating component. FIG. 1 illustrates such a conventional cooling arrangement 10. As is shown, a heat generating component 20, such as a microprocessor, is plugged into a processor socket 30. The processor socket 30 includes a plurality of pins 40, which couple the processor socket 30 to a planar 70, such as a motherboard. A heat sink 50 is coupled to the processor socket 30 using a spring clip 80 which attaches to tabs 60 extruding from the processor socket 30. The pins 40 insert into corresponding holes in the planar 70 and are typically wave soldered into the planar 70.

As shown in FIG. 1A, the spring clip 80 fits into the heat sink 50 and clips onto the tabs 60, thereby securing the heat sink 50 to the socket processor 30. Thus, the tabs 60 support the mass of the heat sink 50. As the heat generated by more powerful processors increases, the heat sink 50 must become more efficient in dissipating the heat. The heat sink 50 may incorporate a fan (not shown) to increase heat dissipation from the microprocessor 20, as is well known to those skilled in the art. Nonetheless, by adding a fan or increasing the size of the heat sink 50, the heat sink 50 necessarily increases in weight. The tabs 60 are generally capable of supporting a heat sink 50 weighing approximately 180 grams. Above 180 grams, the tabs 60 tend to fail by snapping at point A, as illustrated in FIG. 1A.

To address this problem, lighter heat sinks have been designed using different materials (lighter), or by introducing more fins via different fin manufacturing techniques (decreasing material). Nevertheless, these solutions are costly in manufacturing expense and/or materials expense. Another approach has been to replace the tabs 60 with a stronger material, such as metal hooks. In this approach, the metal hooks are coupled to the processor socket 30. Nonetheless, in shock testing, it is found that the heat sink 50 tears the metal hook from the processor socket 30, the failure point being the connection between the metal hook and the processor socket 30. Moreover, the processor socket 30 can become dislodged or displaced from the planar 70 when the heat sink 50 rips the metal hook from the processor socket 30.

Accordingly, a need exists for a more effective system and method for cooling components in a computer system. The system should be able to withstand mechanical shocks and vibrations which often occur during shipping. The system should be compact, highly reliable, and cost effective. The present invention fulfills this need and provides related advantages.

SUMMARY OF THE INVENTION

A system for cooling a component in a computer system is disclosed. The system comprises a socket for receiving the component and for coupling the component to a planar. A heat dissipating element is coupled to the component and to the socket via a plurality of socket tabs coupled to the socket. At least two socket tabs include an embedded reinforcing strip which extends from the socket. A further aspect of the present invention provides securing the socket to the planar by extending the reinforcing strip from each of the at least two socket tabs through the socket and out of a bottom surface of the socket, and coupling the reinforcing strip from each of the at least two socket tabs to the planar.

Through the aspects of the present invention, heat sinks and/or fansinks that could not be secured with conventional socket tabs can now be secured to the socket via the reinforced socket tabs. Furthermore, the socket is firmly attached to the planar via the reinforcing strip which strengthens the socket tab. Thus, the heat sink will remain coupled to the socket, which in turn will remain coupled to the planar in the event of a jarring impact typical during shipping and handling.

DETAILED DESCRIPTION

The present invention relates to cooling components in a computer system, and more particularly to securing a heat sink to the component, while simultaneously securing the component to a planar. The following description is presented to enable one of ordinary skill in the art to make and use the invention and is provided in the context of a patent application and its requirements. Various modifications to the preferred embodiment and the generic principles and features described herein will be readily apparent to those skilled in the art. For instance, although the component in the preferred embodiment is a microprocessor, the present invention could be utilized for any heat generating component which is mounted on a socket. Thus, the present invention is not intended to be limited to the embodiment shown but is to be accorded the widest scope consistent with the principles and features described herein.

In accordance with a preferred embodiment of the present invention, at least two opposing socket tabs are strengthened by a reinforcing strip that is embedded, partially or completely, within each of the at least two opposing socket tabs. The strip extends from the tab, through the socket and out of the socket's underside, such that the strip can be secured to the planar. Accordingly, the reinforcing strip allows the at least two opposing socket tabs to support a heavier heat sink while ensuring that the socket remains securely attached to the planar.

Figure 1:
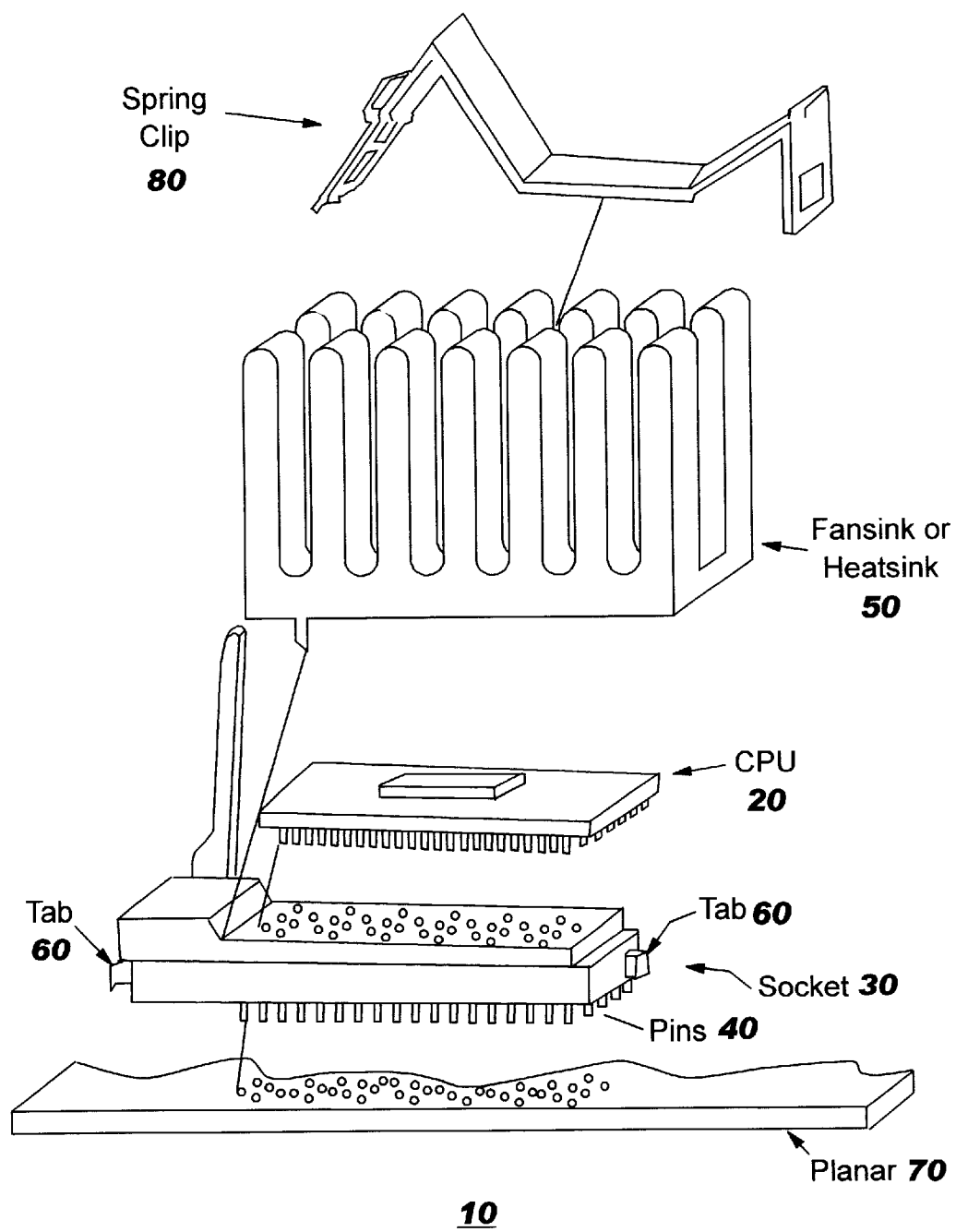
FIGS. 1 and 1A illustrate a conventional PGA socket/heat sink assembly.
Figure 1A:
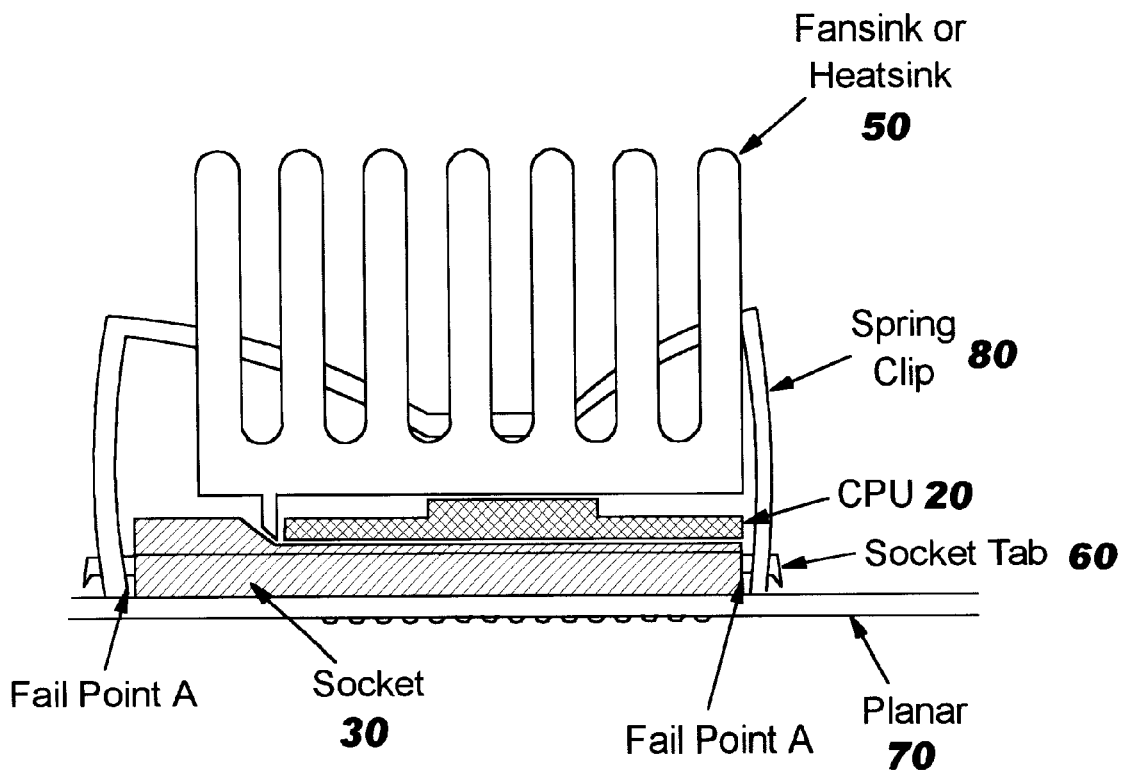
Figure 2:
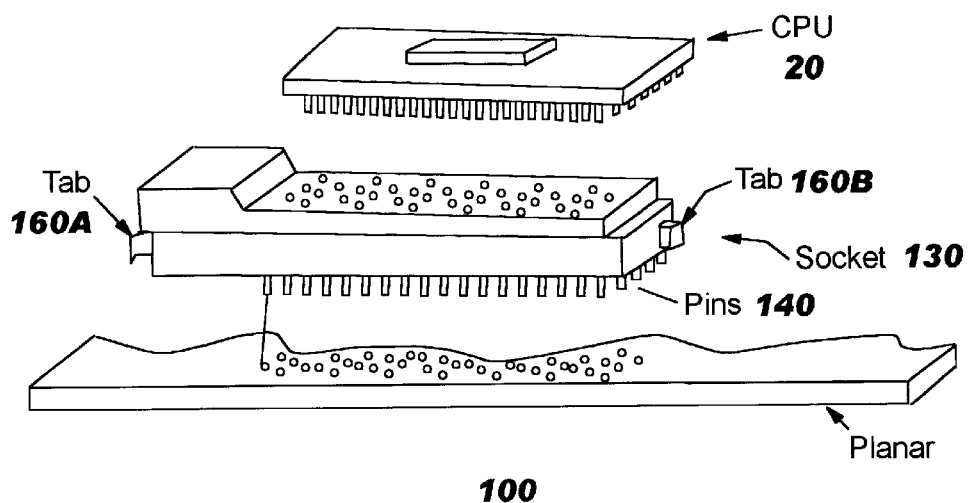
FIG. 2 illustrates the socket according to the preferred embodiment of the present invention.

For a better understanding of the present invention, please refer to FIG. 2, which illustrates a perspective of the processor socket 100 in accordance with a preferred embodiment of the present invention. As is shown, the socket 130 receives a component 20, such as a processor, and includes a plurality of socket tabs 160. The socket 130 couples the component 20 to a planar 70 via a plurality of pins 140. The socket tabs 160 extend out from the socket 130 and curve downward to provide a hook-like area 160a for receiving the spring clip (not shown), which secures the heat dissipating element (not shown), such as a heat sink or fansink. At least two opposing socket tabs 160A, 160B are strengthened by a reinforcing strip (not shown) embedded in each of the two opposing socket tabs 160A, 160B. Preferably, the reinforcing strip is made of a stiff material which is pliable, such as a stainless steel wire having a diameter greater than or equal to 0.8 mm.

Figure 3:
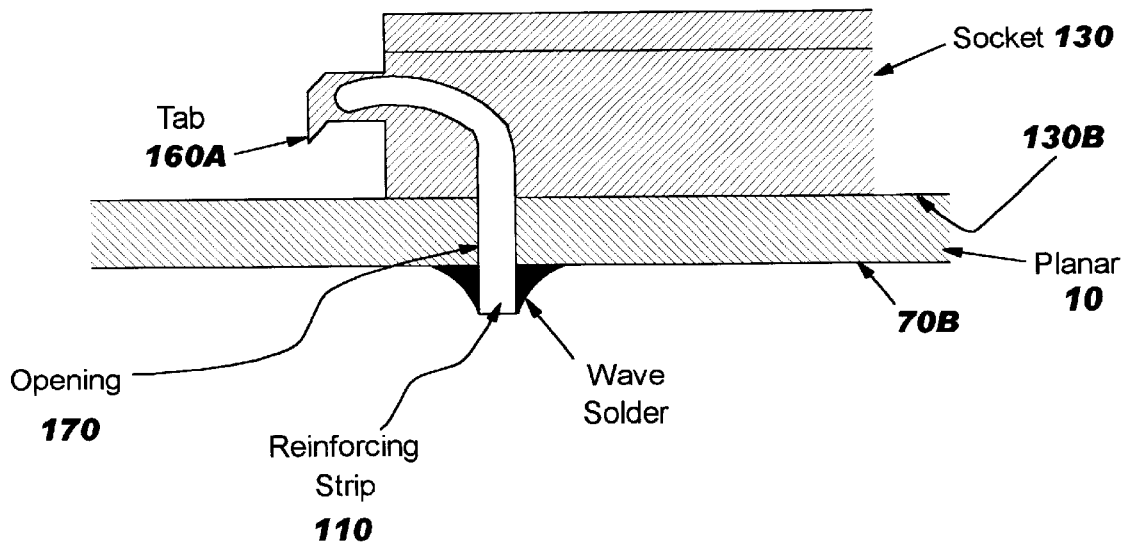
FIG. 3 illustrates a cross-sectional view of the socket and one socket tab in accordance with the preferred embodiment of the present invention.

FIG. 3 provides a cross-sectional view of the socket 130, one of the two opposing socket tabs 160A, and its corresponding reinforcing strip 110. The reinforcing strip 110 extends from the one socket tab 160A, through the socket 130, and protrudes out of a bottom surface 130b of the socket 130. The socket 130 is secured to the planar 70 by threading the reinforcing strip 110 from each of the opposing socket tabs 160A, 160B through a corresponding opening 170 in the planar 70, and attaching each reinforcing strip 110 to a bottom surface 70b of the planar 70. If the reinforcing strip 110 is a stainless steel wire, as described above, the strip 110 can be wave soldered to the bottom 70b of the planar 70.

Figure 4A:
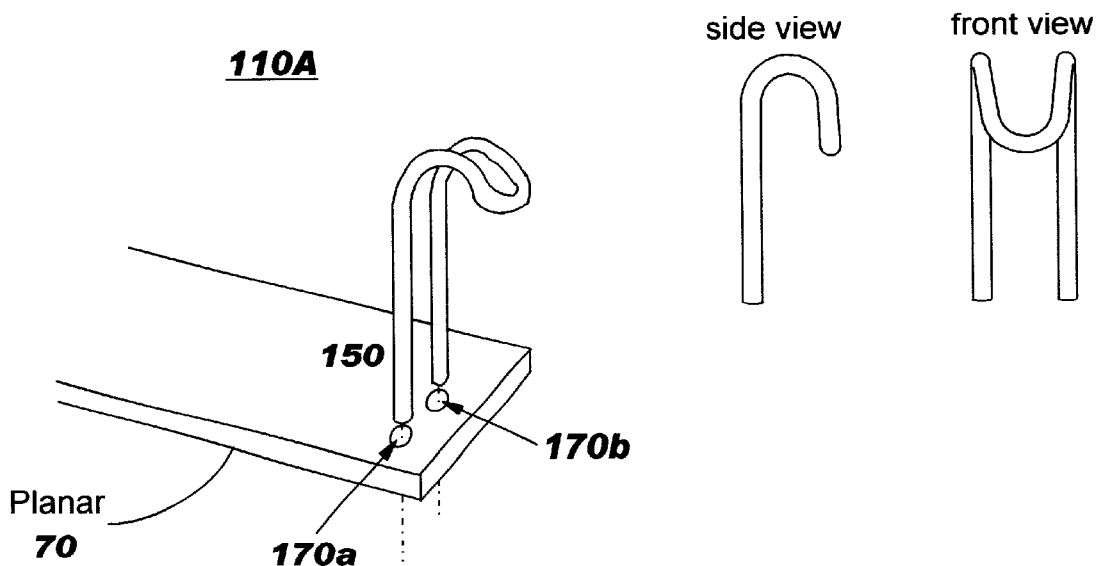
FIGS. 4A and 4B illustrate reinforcing strips in accordance with two embodiments of the present invention.
Figure 4B:
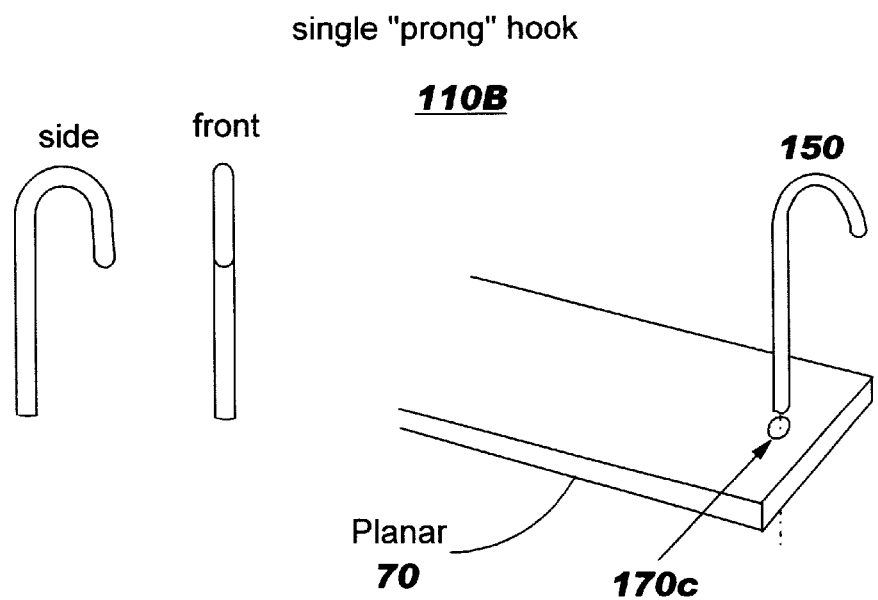

The reinforcing strip 110 can be partially or completely embedded in the socket tab 160A, 160B without affecting the integrity of the socket tab 160A, 160B. So, for example, in FIG. 4A, the reinforcing strip 110A is a two-pronged U-shaped hook. In this embodiment, two corresponding openings 170a, 170b in the planar 70 would be provided for each reinforcing strip 110A utilized. In FIG. 4B, the reinforcing strip 10B is a single-pronged hook. While less robust than its two-pronged counterpart 110A, this reinforcing strip 110B provides the advantage of only requiring one opening 170c in the planar 70 for each reinforcing strip 10B. Thus, if space on the planar 70 is restricted and providing two openings 170a, 170b per reinforcing strip 10A is not feasible, the single pronged reinforcing strip 110B can be utilized.

By utilizing the present invention, at least two of the opposing socket tabs 160A, 160B are strengthened by the reinforcing strip 110. Thus, heat sinks or fan sinks 50 weighing more than 180 g can be supported by the reinforced socket tabs 160A, 160B without breaking the tabs 160A, 160B. Accordingly, heavier heat sinks and/or heat fans can be used and higher heat dissipation requirements can be accommodated without redesigning the heat dissipating element. In addition, and just as important, the socket 130 is firmly attached to the planar 70. Thus, separation of the socket 130 from the planar 70, as well as separation of the heat sink 50 from the socket 130, is less likely, if not entirely eliminated, in the event of a jarring impact such as that typically experienced during shipping and/or handling.

Although the present invention has been described in accordance with the embodiments shown, one of ordinary skill in the art will readily recognize that there could be variations to the embodiments and those variations would be within the spirit and scope of the present invention. For instance, while two embodiments for the reinforcing strip 110A, 110B have been illustrated, one skilled in the art would appreciate that other configurations, such as an S-shaped strip, would fall within the scope of the present invention. Accordingly, many modifications may be made by one of ordinary skill in the art without departing from the spirit and scope of the appended claims.

What is claimed is:

1. A system for cooling a component in a computer system, the system comprising:
   a socket for receiving the component and coupling the component to a planar;
   a heat dissipating element coupled to the component and the socket; and
   a plurality of socket tabs coupled to the socket for attaching the heat dissipating element to the socket, at least two socket tabs including an embedded reinforcing strip extending from the socket.

2. The system of claim 1, wherein one of the at least two socket tabs is disposed at an opposite side of the socket from the other of the at least two socket tabs.

3. The system of claim 2, wherein the socket includes a bottom surface facing the planar and wherein the reinforcing strip for each of the at least two socket tabs extends through the socket and out of the bottom surface of the socket.

4. The system of claim 3, wherein the planar includes a plurality of small holes for receiving the reinforcing strip from each of the at least two socket tabs.

5. The system of claim 4, wherein the reinforcing strip for each of the at least two socket tabs is coupled to the planar, thereby securing the socket to the planar.

6. The system of claim 4, wherein the reinforcing strip comprising a stainless steel wire having a diameter greater than 0.8 mm.

7. The system of claim 6, wherein the reinforcing strip for each of the at least two socket tabs is wave soldered to the planar.

8. The system of claim 2, wherein the reinforcing strip is partially embedded in each of the at least two socket tabs.

9. The system of claim 1, wherein the component is a processor.

10. The system of claim 9, wherein the socket is a PGA socket.

11. The system of claim 1, wherein the heat dissipating element is a heatsink.

12. A processor socket comprising:
   a plurality of socket tabs for securing a heat dissipation element to the processor socket, at least two socket tabs including an embedded reinforcing strip extending from and through a bottom surface of the processor socket; and
   a plurality of pins extending from the bottom surface of the processor socket for coupling the processor socket to a planar.

13. The processor socket of claim 12, wherein the planar includes a plurality of small holes for receiving the reinforcing strip from each of the at least two socket tabs.

14. The processor socket of claim 13, wherein the reinforcing strip from each of the at least two socket tabs is a stainless steel wire having a diameter greater than 0.8 mm.

15. The processor socket of claim 14, wherein the reinforcing strip from each of the at least two socket tabs is wave soldered to the planar, thereby securing the processor socket to the planar.

16. The processor socket of claim 12, wherein one of the at least two socket tabs is disposed at an opposite side of the socket from the other of the at least two socket tabs.

17. The processor socket of claim 12, wherein the heat dissipating element is a heat sink.

18. The processor of claim 12, wherein the heat dissipating element is a fansink.

19. A processor socket comprising:

a plurality of socket tabs for securing a heat dissipation element to the processor socket, at least two socket tabs including an embedded reinforcing strip extending from and through a bottom surface of the processor socket, where in one of the at least two socket tabs is disposed at an opposite side of the socket from the other of the at least two socket tabs and the reinforcing strip is a stainless steel wire; and a plurality of pins extending from the bottom surface of the processor socket for coupling the processor socket to a planar, wherein the planar includes a plurality of small holes for receiving the reinforcing wire from each of the at least two socket tabs and the reinforcing wire from each of the at least two socket tabs is wave soldered to the planar, thereby securing the processor socket to the planar.

20. A system for a component in a computer system, the system comprising:

a socket for receiving the component and coupling the component to a planar, wherein the socket includes a bottom surface facing the planar;

a heat dissipating element coupled to the component and the socket; and a plurality of socket tabs coupled to the socket for attaching the heat dissipating element to the socket, at least two socket tabs including an embedded reinforcing strip extending from the socket, wherein the embedded reinforcing strip extends through the socket and out of the bottom surface of the socket.

21. A processor socket comprising:

a plurality of socket tabs for securing a heat dissipation element to the processor socket, at least two socket tabs including an embedded reinforcing strip extending from and through a bottom surface of the processor socket, wherein the reinforcing strip is a stainless steel wire having a diameter greater than 0.8 mm; and a plurality of pins extending from the bottom surface of the processor socket for coupling the processor socket to a planar.

22. A processor socket comprising:

a plurality of socket tabs for securing a heat dissipation element to the processor socket, at least two socket tabs including an embedded reinforcing strip extending from and through a bottom surface of the processor socket; and a plurality of pins extending from the bottom surface of the processor socket for coupling the processor socket to a planar, wherein the reinforcing strip is wave soldered to the planar, thereby securing the processor socket to the planar.

* * * * *